US008089530B2

(12) United States Patent
Mabuchi

(10) Patent No.: US 8,089,530 B2
(45) Date of Patent: Jan. 3, 2012

(54) SOLID-STATE IMAGE PICKUP APPARATUS, DRIVE METHOD FOR THE SOLID-STATE IMAGE PICKUP APPARATUS, AND IMAGE PICKUP APPARATUS

(75) Inventor: Keiji Mabuchi, Kanagawa (JP)

(73) Assignee: Sony Corporation, Tokyo (JP)

(*) Notice: Subject to any disclaimer, the term of this patent is extended or adjusted under 35 U.S.C. 154(b) by 385 days.

(21) Appl. No.: 12/521,229

(22) PCT Filed: Nov. 27, 2007

(86) PCT No.: PCT/JP2007/072836
§ 371 (c)(1),
(2), (4) Date: Jun. 25, 2009

(87) PCT Pub. No.: WO2008/078493
PCT Pub. Date: Jul. 3, 2008

(65) Prior Publication Data
US 2009/0273695 A1 Nov. 5, 2009

(30) Foreign Application Priority Data
Dec. 27, 2006 (JP) ................. 2006-352562

(51) Int. Cl.
*H04N 5/235* (2006.01)
*H04N 5/202* (2006.01)
*H04N 17/00* (2006.01)
*H04N 17/02* (2006.01)
*H04N 3/14* (2006.01)
*H04N 5/335* (2011.01)
*H04N 5/228* (2006.01)
*G06K 9/38* (2006.01)
*G06K 9/40* (2006.01)

(52) U.S. Cl. ......... 348/229.1; 348/255; 348/193; 348/296; 348/300; 348/301; 348/208.4; 382/270; 382/274

(58) Field of Classification Search ......... 348/255, 348/229.1, 300, 301, 308, 296, 362, 193, 348/223.1, 372, 208.12, 221.1, 364, 208.16, 348/208.4; 382/295, 270, 218; 359/831, 359/678, 669, 638, 489.09, 485.06; 330/254, 330/274, 290; 396/55
See application file for complete search history.

(56) References Cited
U.S. PATENT DOCUMENTS
6,720,933 B2 * 4/2004 Hanlin et al. ............ 343/786
(Continued)

FOREIGN PATENT DOCUMENTS
JP 05-064083 3/1993
(Continued)

OTHER PUBLICATIONS
Japanese Patent Office Action corresponding to Japanese Serial No. 2006-352562 dated Jun. 8, 2010.

*Primary Examiner* — Jason Chan
*Assistant Examiner* — Stephen Coleman
(74) *Attorney, Agent, or Firm* — SNR Denton US LLP

(57) ABSTRACT

In a solid-state image pickup apparatus having a pixel array unit composed by two-dimensionally arranging pixels for detecting a physical quantity in a row-column manner, pixel signals of a plurality of systems having different sensitivities are read from the pixel array unit in an analog manner, the pixel signals of the plurality of systems are amplified at respective basis amplification rates when a gain setting of the analog pixel signals is lower than a predetermined gain, and a pixel signal of at least one system having a high sensitivity among the plurality of systems is amplified at a plurality of amplification rates including an amplification rate higher than a basis amplification rate of the system having the high sensitivity when the gain setting is equal to or higher than the predetermined gain.

10 Claims, 7 Drawing Sheets

U.S. PATENT DOCUMENTS

| | | | |
|---|---|---|---|
| 2005/0248660 A1* | 11/2005 | Stavely et al. | 348/208.16 |
| 2006/0119738 A1* | 6/2006 | Kido | 348/571 |
| 2009/0201402 A1* | 8/2009 | Kim et al. | 348/300 |

FOREIGN PATENT DOCUMENTS

| | | |
|---|---|---|
| JP | 09-200617 | 7/1997 |
| JP | 2002-044515 | 2/2002 |
| JP | 2004-128562 | 4/2004 |
| JP | 2004-363666 | 12/2004 |
| JP | 3680366 | 5/2005 |
| JP | 2005-175517 | 6/2005 |
| JP | 2006-333035 | 12/2006 |

* cited by examiner

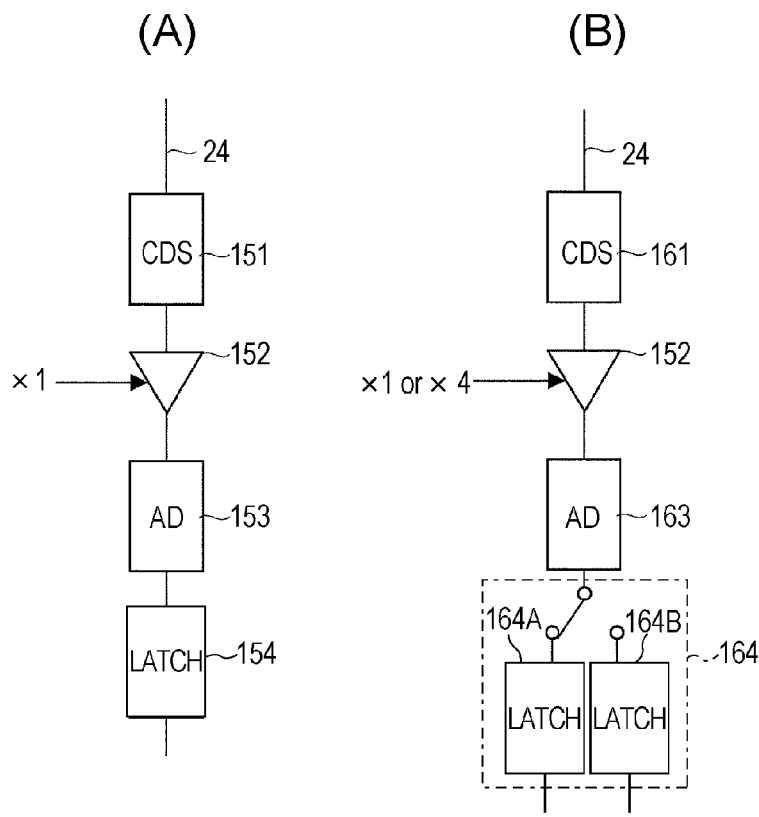

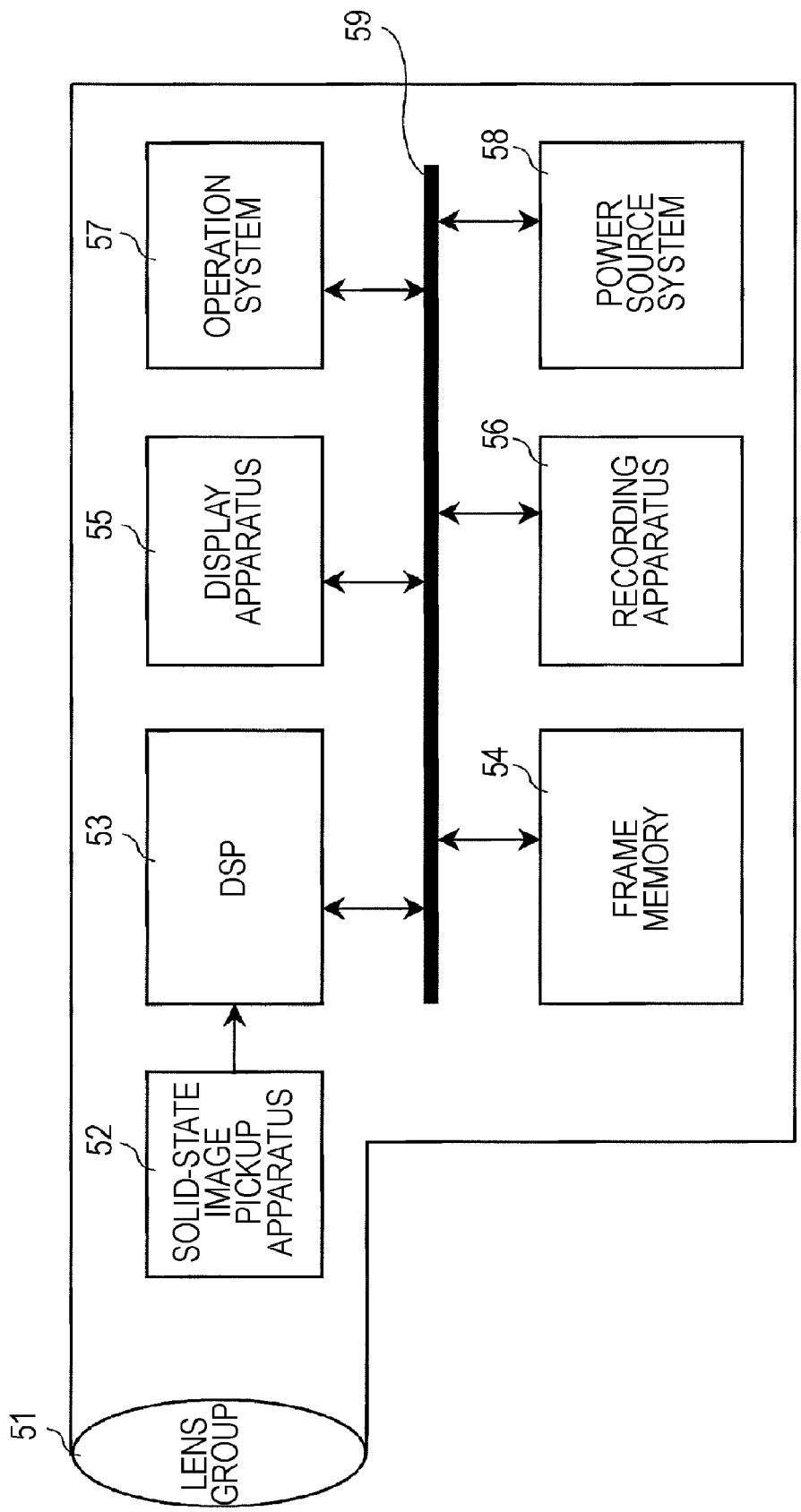

SOLID-STATE IMAGE PICKUP APPARATUS, DRIVE METHOD FOR THE SOLID-STATE IMAGE PICKUP APPARATUS, AND IMAGE PICKUP APPARATUS

TECHNICAL FIELD

The present invention relates to a solid-state image pickup apparatus, a drive method for the solid-state image pickup apparatus, and an image pickup apparatus, and more specifically relates to a solid-state image pickup apparatus using a technology for a wider dynamic range, a drive method for solid-state image pickup apparatus, and an image pickup apparatus using the solid-state image pickup apparatus.

BACKGROUND ART

In a solid-state image pickup apparatus, for example, a MOS (Metal Oxide Semiconductor) type image pickup apparatus, a technology is widely known that exposure times (accumulation times) are varied regarding the respective pixels in a pixel array unit composed by two-dimensionally arranging pixels including photoelectric conversion elements in a row-column manner, a signal having a high sensitivity and a signal having a low sensitivity are obtained depending on long and short exposure times, and the signal having the high sensitivity and the signal having the low sensitivity are synthesized for realizing a wider dynamic range.

As one of technologies for realizing a wider dynamic range, a technology is known for expanding the dynamic range by executing read of signals on a same pixel by plural times while changing the exposure time and synthesizing the respective signals obtained through the read operations performed by the plural times in a signal processing system in a later stage (for example, see Japanese Patent No. 3680366).

DISCLOSURE OF INVENTION

In the case of the above-mentioned conventional technology described in Japanese Patent No. 3680366, information of a low luminance part of a screen is obtained from a signal having a long exposure time, and information of a high luminance part is obtained from a signal having a short exposure time. However, when a subject has a low luminance, at least the longer exposure time needs to be extended, but a limit exists for extending the longer exposure time. For example, in a moving image, in general, the exposure time can only take up to 1/30 second at a maximum. Also, in a still image too, in order to suppress hand shake or subject blurring, it is desired in some cases that the exposure time is not extended up to equal to or more than a certain time.

In these cases, as the signal amount is small even in the longer exposure time, a gain setting of the solid-state image pickup apparatus is increased. In order to increase the gain setting, there are two ways: a case of increase an analog gain before an AD conversion and a case of increase a digital gain after the AD conversion.

When the digital gain is increased, a gradation becomes coarse. When the analog gain is increased, in a case where a part of a screen is bright, the bright part exceeds an input range of the AD conversion. The signal actually exists, but it is discarded, and thus the information loss occurs. Of course, a signal of the bright part can be obtained from a signal during the short exposure time, but as compared with a signal during the long exposure time, an S/N of an image to be obtained is degraded due to a bad S/N.

In view of the above, according to the present invention, it is an object to provide a solid-state image pickup apparatus, a drive method for the solid-state image pickup apparatus, and an image pickup apparatus in which for realizing a wider dynamic range by obtaining signals of a plurality of systems having different sensitivities, when the analog gain is increased, the information loss due to deviation from the input range of the AD conversion is eliminated, and it is possible to obtain an image with a good S/N.

In order to achieve the above-mentioned object, according to the present invention, in a solid-state image pickup apparatus having a pixel array unit composed by two-dimensionally arranging pixels for detecting a physical quantity in a row-column manner and an image pickup apparatus using the solid-state image pickup apparatus, pixel signals of a plurality of systems having different sensitivities are read in an analog manner from the pixel array unit, and the pixel signals of the plurality of systems are amplified at respective basic amplification rates when a gain setting of the analog pixel signals is lower than a predetermined gain, and a pixel signal of at least one system having a high sensitivity among the plurality of systems amplified at a plurality of amplification rates including an amplification rate higher than a basis amplification rate of the system having the high sensitivity when the gain setting is equal to or higher than the predetermined gain.

In the solid-state image pickup apparatus and the image pickup apparatus of the above-mentioned configurations, when the gain setting of the analog gain is lower than the predetermined gain, by amplifying the pixel signals of the plurality of systems at the respective basic amplification rates to be synthesized by a signal processing system in a later stage, it is possible to expand a dynamic range in accordance with a sensitivity ratio of the plurality of systems.

On the other hand, when the gain setting of the analog gain is equal to or higher than the predetermined gain, by amplifying the pixel signal of at least one system having the high sensitivity at the plurality of amplification rates including the amplification rate higher than the basis amplification rate of the system having the high sensitivity and synthesizing the signals amplified at the plurality of amplification rates in a signal processing system in a later stage, it is possible to obtain the gain up signals in accordance with a ratio of the plurality of amplification rates.

According to this, in a case where the subject has a low luminance or the like, even if the analog gain is increased to increase the sensitivity, for example, in a case where a part of the screen is bright, as the bright part does not exceed the input range of the AD conversion. Thus, a failure of obtaining the originally excising signals from the signals of the long exposure time is not caused, and also the gradation at the low luminance part is not degraded.

BRIEF DESCRIPTION OF DRAWINGS

FIG. 4 are block diagrams of configuration examples of a column signal processing circuit.

FIG. 5 show processing sequences of a column signal processing according to Embodiment 1.

FIG. 10 is a block diagram showing a configuration example of an image pickup apparatus according to the present invention.

BEST MODES FOR CARRYING OUT THE INVENTION

Hereinafter, embodiments of the present invention will be described in detail with reference to drawings.

Figure 1:
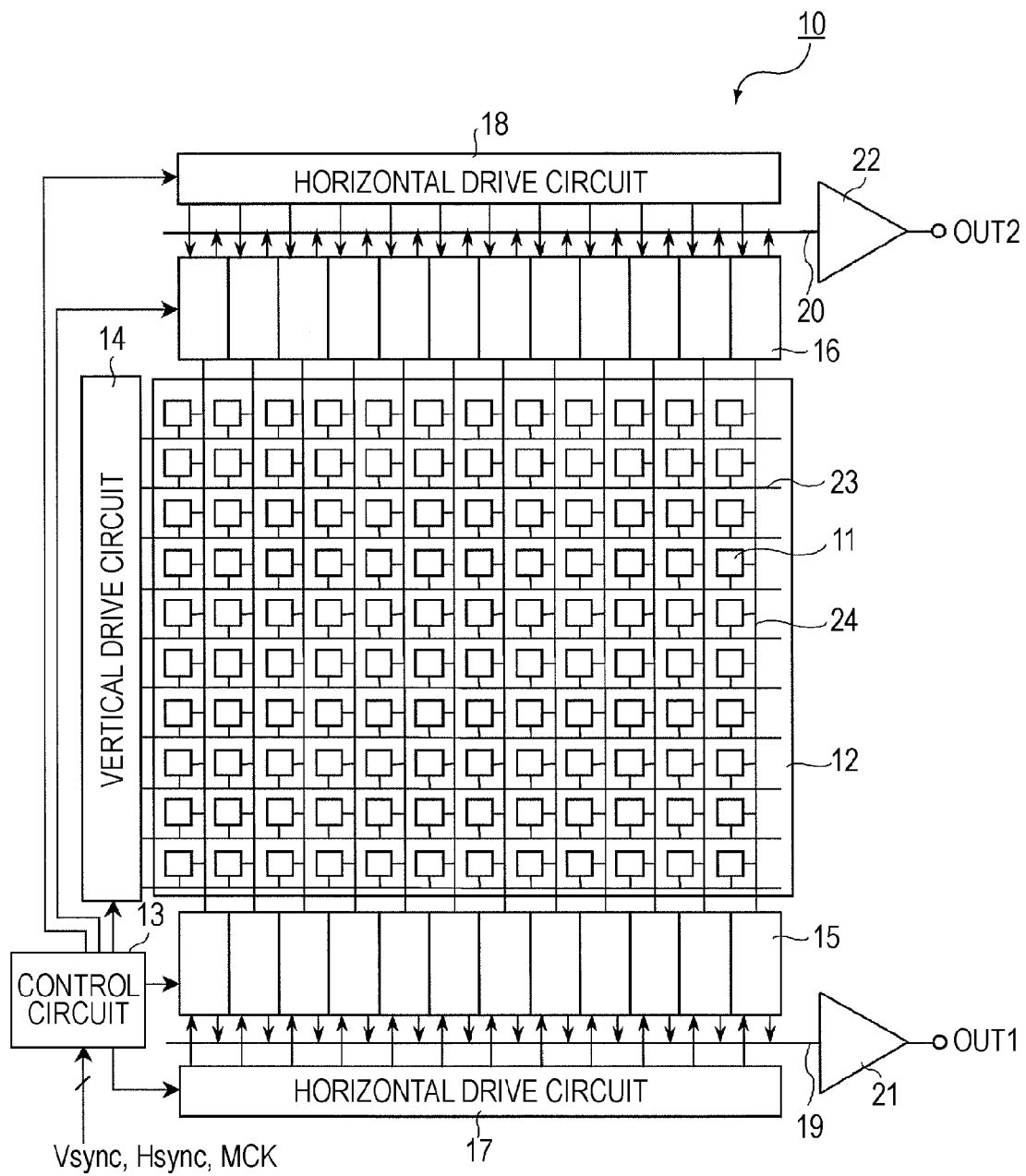
FIG. 1 is a system configuration diagram showing an outline of a CMOS image sensor according to an embodiment of the present invention.

FIG. 1 is a system configuration diagram showing an outline of a solid-state image pickup apparatus according to an embodiment of the present invention. According to the present embodiment, for example, a description will be given while taking as an example a CMOS image sensor as the solid-state image pickup apparatus for detecting a charge amount in accordance with a light amount of visible light as a physical quantity in units of pixel.
(Configuration of CMOS Image Sensor)

As shown in FIG. 1, a CMOS image sensor 10 according to the present embodiment has a pixel array unit 12 composed by two-dimensionally arranging unit pixels 11 (unit sensors) in a row-column manner (matrix manner) including photoelectric conversion elements for performing a photoelectric conversion of incident visible light into a charge amount in accordance with the light amount.

In addition to this pixel array unit 12, the CMOS image sensor 10 has a control circuit 13 as control means for controlling an entire system, a vertical drive circuit 14 as drive means for driving the respective pixels 11 of the pixel array unit 12, and column signal processing circuits and 16 of n systems (n is an integer equal to or larger than 2, and n=2 in the present example), horizontal drive circuits 17 and 18, horizontal signal lines 19 and 20, and output circuits 21 and 22 as signal processing means for processing signals output from the respective pixels 11.

Then, the CMOS image sensor 10 according to the present embodiment has a system configuration in which two-system signal processing means, that is, the column signal processing circuit 15, the horizontal drive circuit 17, the horizontal signal line 19, and the output circuit 21, and the column signal processing circuit 16, the horizontal drive circuit 18, the horizontal signal line 20, and the output circuit 22 are respectively arranged on both upper and lower sides of the pixel array unit 12.

In this system configuration, the control circuit 13 receives data for instructing an operation mode or the like of the present CMOS image sensor 10 from an outside, and also outputs data including information of the present CMOS image sensor 10 to the outside.

On the basis of a vertical synchronous signal Vsync, a horizontal synchronous signal Hsync, and a master clock MCK, the control circuit 13 further generates a clock signal, a control signal, and the like which become references for circuit operations of the vertical drive circuit 14, the column signal processing circuits 15 and 16, the horizontal drive circuits 17 and 18, and the like. The clock signal, the control signal, and the like which are generated by the control circuit 13 are provided to the vertical drive circuit 14, the column signal processing circuits 15 and 16, the horizontal drive circuits 17 and 18, and the like.

In the pixel array unit 12, the unit pixels (hereinafter, which may also be simply described as "pixels" in some cases) 11 are two-dimensionally arranged in the row-column manner. As shown in FIG. 1, the unit pixels 11 are lined and arranged substantially in a square grid. This means that optical openings defined by the photoelectric conversion elements, metal wiring, and the like are lined and arranged in the square grid substantially, and circuit parts of the unit pixels 11 are not limited to this. That is, the circuit parts of the unit pixels 11 which will be described below do not necessarily need to be lined and arranged substantially in the square grid.

In the pixel array unit 12, further, pixel drive wirings 23 are formed along a left-right direction of the drawing (an arrangement direction for pixels on pixel rows) for each pixel row with respect to the column-row arrangement of the unit pixels 11, and vertical signal lines 24 are formed along an up-down direction (an arrangement direction for pixels on pixel columns) of the drawing for each pixel column. One ends of the pixel drive wirings 23 are connected to output terminals corresponding to the respective pixel rows of the vertical drive circuit 14.

The vertical drive circuit 14 is composed of a shift register, an address decoder, or the like, sequentially selects and scans the respective pixels 11 of the pixel array unit 12 in units of row, and supplies a necessary drive pulse (control pulse) to the respective pixels on the selected row via the pixel drive wirings 23.

Although a graphic representation is omitted regarding a specific configuration, the vertical drive circuit 14 is configured to have a read scan system for sequentially performing a selection scan on the pixels 11 for reading the signals in units of row and a flush scan system for performing with respect to the read row where the read scan is performed by the read scan system, a flush scan for sweeping out (resetting) unnecessary charges from the photoelectric conversion elements of the pixels 11 on the read row in prior to the read scan by a duration of a shutter speed.

With the sweeping out (resetting) of the unnecessary charge by this flush scan system, a so-called electronic shutter operation is performed. Hereinafter, the flush scan system is referred to as electronic shutter scan system. At this time, the electronic shutter operation refers to an operation of discarding the photo-generated charges of the photoelectric conversion elements and newly starting exposure (starting accumulation of photo-generated charges).

The signals read through the read operation by the read scan system correspond to light amounts incident at the immediately preceding read operation, or the electronic shutter operation or thereafter. Then, a period from a read timing by the immediately preceding read operation or a sweeping out timing by the electronic shutter operation up to a read timing of the read operation of this time becomes an accumulation time (exposure time) of the photo-generated charges in the unit pixels 11.

The signals output from the respective pixels 11 on the selected row are supplied to the column signal processing circuit 15 or the column signal processing circuit 16 via each of the vertical signal lines 24. The column signal processing circuits 15 and 16 are respectively arranged on the upper and lower of the pixel array unit 12 for each pixel column, for example, of the pixel array unit 12, that is, with a one-on-one correspondence relation with respect to the pixel column.

For each pixel row of the pixel array unit 12, these column signal processing circuits 15 and 16 receive the signals output from the respective pixels 11 on the selected row for each pixel column and perform a signal processing on the signal such as CDS (Correlated Double Sampling; correlated double sampling) for removing fixed pattern noise inherent to the pixel, signal amplification, or AD conversion.

It should be noted that herein, the case is described while taking as an example in which the configuration of arranging the column signal processing circuits 15 and 16 with the one-on-one correspondence relation with respect to the pixel column is adopted, but is not limited to this configuration. For example, it is possible to adopt a configuration or the like such that the column signal processing circuits 15 and 16 are arranged for each of a plurality of pixel columns (the vertical signal lines 24), and these column signal processing circuits 15 and 16 are commonly used in a time division between a plurality of pixel columns.

The horizontal drive circuit 17 is composed of a shift register, an address decoder, or the like and selects the column signal processing circuits 15 in order by sequentially outputting horizontal scan pulses. Similarly to the horizontal drive circuit 17, the horizontal drive circuit 18 is also composed of a shift register, an address decoder, or the like and selects the column signal processing circuits 16 in order by sequentially outputting horizontal scan pulses.

It should be noted that although a graphic representation is omitted, in respective output stages of the column signal processing circuits 15 and 16, horizontal selection switches are provided while being connected between the horizontal signal lines 19 and 20. The horizontal scan pulses φH1 to φHx sequentially output from the horizontal drive circuits 17 and 18 turns ON the horizontal selection switches in order which are provided to the respective output stages of the column signal processing circuits 15 and 16. These horizontal selection switches respond to the horizontal scan pulses and are turned ON in order, and the pixel signals processed in the column signal processing circuits 15 and 16 for each pixel column are output to the horizontal signal lines 19 and 20 in order.

The output circuits 21 and 22 apply various signal processings on the pixel signals sequentially supplied from each of the column signal processing circuits 15 and 16 via the horizontal signal lines 19 and 20 for the output. As a specific signal processing in these output circuits 21 and 22, for example, there is a case where only buffering is performed, or before the buffering, block level adjustment, fluctuation correction for each column, signal amplification, color-related processing or the like may also be performed.

(Circuit Configuration of Unit Pixel)

Figure 2:
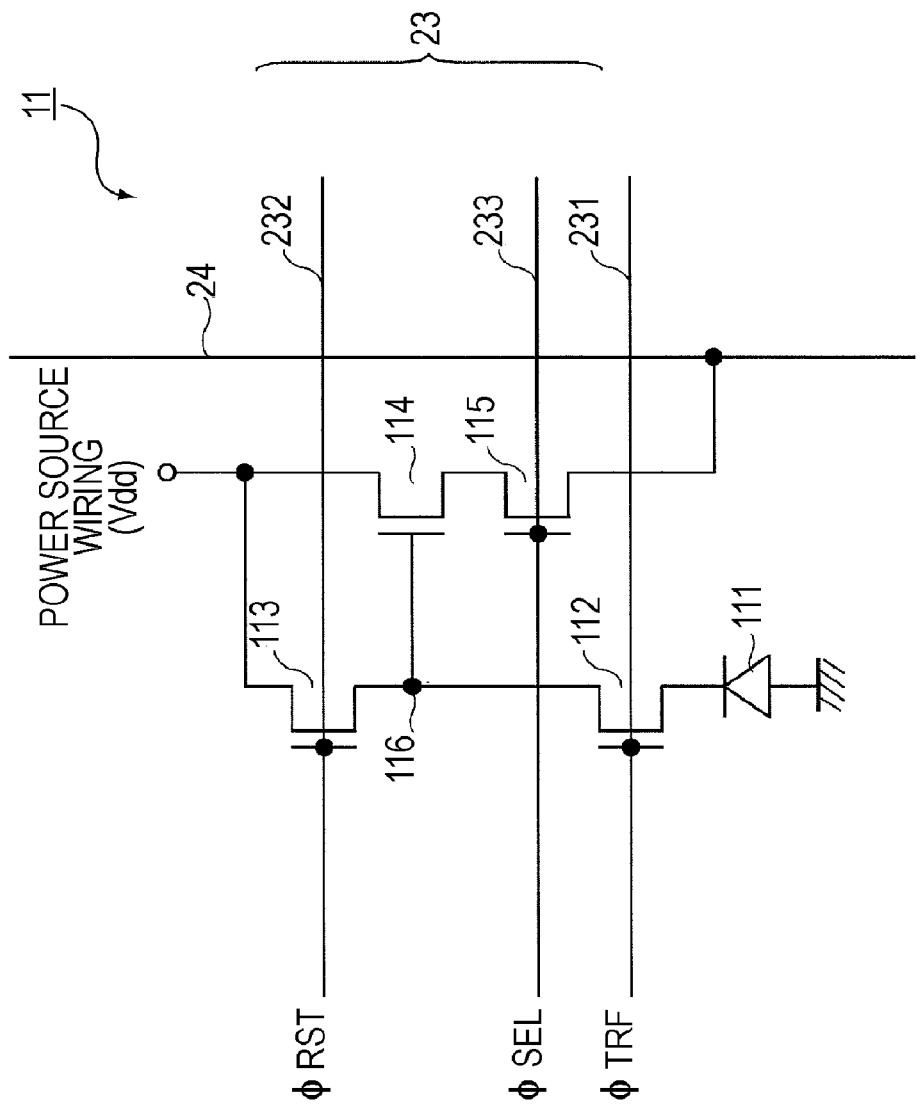
FIG. 2 is a circuit diagram showing an example of a circuit configuration of a unit pixel.

FIG. 2 is a circuit diagram showing an example of a circuit configuration of the unit pixel 11. As shown in FIG. 2, the unit pixel 11 according to the present circuit example has a pixel circuit having four transistors, for example, a transfer transistor 112, a reset transistor 113, an amplification transistor 114, and a selection transistor 115 in addition to a photoelectric conversion element, for example, a photo diode 111.

Herein, for these transistors 112 to 115, for example, N-channel MOS transistors are used. In this regard, combinations of conductivity types of the transfer transistor 112, the reset transistor 113, the amplification transistor 114, and the selection transistor 115 herein are merely an example and are not limited to these combinations.

With respect to this unit pixel 11, as the pixel drive wirings 23, for example, three drive wirings of a transfer wiring 231, a reset wiring 232, and a selection wiring 233 are commonly provided to the respective pixel on the same pixel row. Respective one ends of these transfer wiring 231, the reset wiring 232, and the selection wiring 233 are connected to output terminals corresponding to the respective pixel rows of the vertical drive circuit 14 in units of pixel row.

In the photo diode 111, an anode is connected to a negative side power source, for example, ground, and performs a photoelectric conversion on the received light into photo-generated charges (herein, photoelectrons) of the charge amount in accordance with the light amount (physical quantity). The cathode of the photo diode 111 is electrically connected via the transfer transistor 112 to a gate of the amplification transistor 114. A node 116 electrically connected to this gate of the amplification transistor 114 is referred to as FD (floating diffusion) unit.

The transfer transistor 112 is connected between the cathode of the photo diode 111 and the FD unit 116, enters an ON state as a transfer pulse PTRF whose high level (for example, Vdd level) is active (hereinafter, described as "High active") is provided via the transfer wiring 231 to the gate, and transfers the photo-generated charges subjected to the photoelectric conversion in the photo diode 111 to the FD unit 116.

While drain is connected to a pixel power source Vdd and a source is connected to the FD unit 116, respectively, the reset transistor 113 enters an ON state as a High active reset pulse φRST is provided via the reset wiring 232 to the gate and discards the charges of the FD unit 116 to the pixel power source Vdd in prior to transfer of the signal charges from the photo diode 111 to the FD unit 116 to reset the FD unit 116.

While a gate is connected to the FD unit 116 and a drain is connected to the pixel power source Vdd, respectively, the amplification transistor 114 outputs a potential at the FD unit 116 after being reset by the reset transistor 113 as a reset level, and further outputs a potential at the FD unit 116 after the signal charges are transferred by the transfer transistor 112.

While, for example, a grain is connected to the source of the amplification transistor 114 and a source is connected to the vertical signal lines 24, respectively, the selection transistor 115 enters an ON state as a High active selection pulse PSEL is provided via the selection wiring 233 to the gate, and relays the signals output from the amplification transistor 114 while the unit pixel 11 is in a selection state to the vertical signal lines 24.

It should be noted that a circuit configuration in which the selection transistor 115 is connected between the pixel power source Vdd and the drain of the amplification transistor 114 can also be adopted.

Also, the unit pixel 11 is not limited to the above-mentioned configuration of the four-transistor configuration and may be of a three-transistor configuration doubling as the amplification transistor 114 and the selection transistor 115 and the like, and its circuit configuration becomes irrelevant.

(Feature of the Present Embodiment)

In the CMOS image sensor 10 according to the present embodiment of the above-mentioned configuration, for realizing a wider dynamic range, a plurality of systems having different sensitivities, in the present example, signals of two systems are obtained from the respective pixels 11 of the pixel array unit 12.

The vertical drive circuit 14 executes the shutter scan by the electronic shutter scan system and the read scans of the two systems by the read scan system with respect to the respective pixels 11 of the pixel array unit 12 and varies detection times during which the pixels 11 detect the light amounts as the physical quantities, that is, the exposure times, so that the signals of the two systems having different sensitivities are obtained (the sensitivities of the signals of the two systems are varied). The length of this exposure time (detection time) is adjusted at an interval of the read scans of the two. Hereinafter, a specific description is provided.

Figure 3:
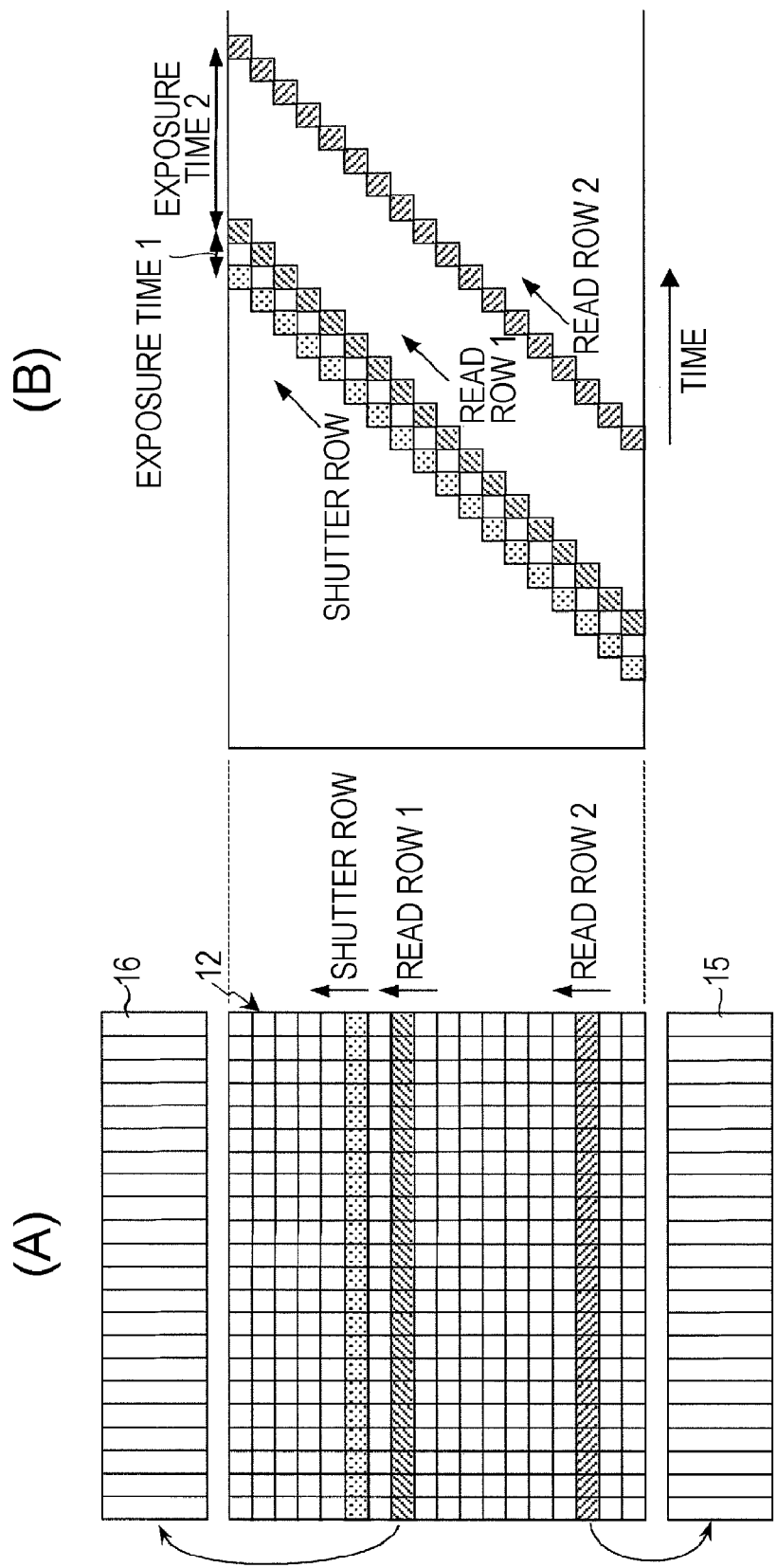
FIG. 3 are explanatory diagrams for a shutter scan for obtaining signals of two systems having different sensitivities and read scans of two systems, in which (A) shows a concept of a manner of allocating signals, and (B) shows concepts of the shutter scan and the scans of two systems, respectively.

In the read scans, as shown in FIG. 3(A), scans are performed on two pixel rows as read rows 1 and 2 of the two systems respectively, and signals of the respective pixels from these two read rows 1 and 2 are read to each of the vertical signal lines 24. It should be noted that the column signal processing circuits 15 and 16 of the two systems are provided while corresponding to the read scans of the two systems.

With this vertical scan, as shown in FIG. 3(B), a time for scanning from a shutter row to the read row 1 where the read scan for the first time is performed becomes an exposure time 1, and a time for scanning from the read row 1 to the read row 2 where the read scan for the second time is performed becomes an exposure time 2. Thus, by varying these continuous exposure times (accumulation times) 1 and 2, signals having different sensitivities, that is, a signal having a low sensitivity based on the shorter exposure time 1 and a signal having a high sensitivity based on the longer exposure time 2 can be continuously obtained from the same pixel. Setting of the exposure times 1 and 2 is performed by the control circuit 13.

The signals having different sensitivities, that is, the signal having a low sensitivity and the signal having a high sensitivity are synthesized by a signal processing circuit in a later stage (not shown) in the drawing, so that it is possible to obtain an image signal with a wide dynamic range. In fact, such shutter scan and read scan can be realized by the following configurations.

As described above, in the vertical drive circuit 14 having the read scan system and the electronic shutter scan system (the flush scan system), the electronic shutter scan system is configured by a shift register, for example. By outputting the electronic shutter pulses from the shift register from the first row in units of pixel row in order, it is possible to perform a so-called rolling shutter operation (or, a focal plane shutter operation) in which the shutter scans are sequentially performed from the first row.

On the other hand, the read scan system is configured by two lines of shift registers. By sequentially outputting scan pulses 1 and 2 for selecting the read rows 1 and 2 from the two lines of shift registers, it is possible to perform the read scans of the two systems. Also, by also configuring the read scan system by an address decoder and through a specification of respective addresses of the read rows 1 and 2 by the address decoder, it is possible to perform the read scans of the two systems.

In this way, by executing the shutter scan by the electronic shutter scan system and the read scans of the two systems by the read scan system, it is possible to obtain the signals of the two systems having different sensitivities.

Specifically, as shown in FIG. 3(A), first, the shutter row is scanned, and thereafter, the two read rows 1 and 2 are scanned. For example, the signals output from the respective pixels on the read row 1 can be read to the column signal processing circuit 15, and the signals output from the respective pixels on the read row 2 can be read to the column signal processing circuit 16, respectively. Combinations of the read rows 1 and 2 and the column signal processing circuits 15 and 16 can be varied.

At which row between the read rows 1 and 2 the signals are read to which circuit between the column signal processing circuits 15 and 16 are decided at operation timings of each of the column signal processing circuits 15 and 16. That is, if the column signal processing circuit 15 (16) is operated at the scan timing of the read row 1, the signals of the respective pixels on the read row 1 are read to the column signal processing circuit 15 (16), and if the column signal processing circuit 16 (15) is operated at the scan timing of the read row 2, the signals of the respective pixels on the read row 2 are read to the column signal processing circuit 16 (15).

In FIG. 3(B), a state of the scan is shown while a horizontal axis represents a time. Herein, the read row 1 is for the short exposure time 1, and the read row 2 is for the long exposure time 2. In order to facilitate the understanding, as an example, the exposure time 1 is set as a time 2 H for two rows (h is a horizontal period), and the exposure time 2 is set as a time 8 H for eight rows. Thus, the sensitivities of the respective pixels on the read row 1 are low, and the sensitivities of the respective pixels on the read row 2 are higher than those of the respective pixels on the read row 1 at 4-fold.

(Column Signal Processing Circuit)

FIG. 4 are block diagrams of configuration examples of the column signal processing circuits 15 and 16. In FIG. 4, (A) shows a configuration of the column signal processing circuit 15, and (B) shows a configuration of the column signal processing circuit 16, respectively. Herein, for convenience of the description, the column signal processing circuits 15 and 16 are both written in a direction where the signals flow from the top to the bottom.

The column signal processing circuit 15 is composed of a CDS circuit 151, an amplification circuit 152, an AD conversion circuit 153, and a latch circuit 154.

In this column signal processing circuit 15, the CDS circuit 151 performs the CDS processing for taking the different between the reset level and the signal level described above supplied from the pixels 11 via the vertical signal lines 24 to eliminate the fixed noise pattern inherit to the pixel from the signal level in accordance with the light amount of the incident light.

The amplification circuit 152 has a basis amplification rate (this is set as x1) with which a maximum signal amplification of the vertical signal lines 24 substantially falls within the input range of the AD conversion circuit and amplifies the output signal of the CDS circuit 151 at the basis amplification rate.

The AD conversion circuit 153 converts the analog signal after the amplification in the amplification circuit 152 into a digital signal. The latch circuit 154 stores digital data subjected to the AD conversion and output from the AD conversion circuit 153.

The column signal processing circuit 16 has basically also the same configuration as the column signal processing circuit 15. Specifically, the column signal processing circuit 16 is composed of a CDS circuit 161, an amplification circuit 162, an AD conversion circuit 163, and a latch circuit 164, and circuit operations of the respective circuits 161 to 164 are basically also the same as the circuit operations of the respective circuits 151 to of the column signal processing circuit 15.

In this regard, the column signal processing circuit 16 has a different configuration from the column signal processing circuit 15 in the following point. That is, the amplification circuit 162 has two circuit systems of a circuit system for amplifying the signal at a first amplification rate and a circuit system for amplifying the signal at a second amplification rate, and the two circuit systems can be switched by an instruction from the control circuit 13 (see FIG. 1).

At this time, as the first amplification rate, the basis amplification rate that is the same as the amplification circuit 152 of the column signal processing circuit 15 is set. As the second amplification rate, by predetermined times of the basis amplification rate, in the present example, an four-fold amplification rate (x4) corresponding to the sensitivity ratio of the respective pixel on the read rows 1 and 2 is set.

It should be noted that herein, in order to facilitate the understanding, in the configuration, the amplification circuit 162 is configured of the two systems whose amplification rates are different from each other, and the circuit systems of these two systems are switched, but to elaborate, a configuration where the amplification rates can be switched may suffice. A specific circuit example where the amplification rates can be switched will be described below.

Also, the latch circuit 164 is composed of two latch circuits 164A and 164B. The AD conversion data when the signal is amplified at the first amplification rate in the amplification circuit 162 is latched (stored) by the latch circuit 164A, and the AD conversion data when the signal is amplified at the second amplification rate is latched by the latch circuit 164B, respectively.

Herein, in order to facilitate the understanding, the example in which the latch circuit 164 is configured by the two latch circuits 164A and 164B has been described. However, for example, a configuration can also be adopted that bits of the one latch circuit 164 are divided into an upper-order side and a lower-order side, and the bits on the upper-order side and the bits on the lower-order side function as two latch circuits.

In the column signal processing circuits 15 and 16 described above, the respective basis amplification rates are set to be equal to each other, but this is not an absolutely necessary condition, and they may also be different from each other. In this regard, if the respective basis amplification rates of the column signal processing circuits 15 and 16 are equal to each other, it is advantageous in the performance of the subsequent signal processing.

Also, in the column signal processing circuits 15 and 16, in general, the AD conversion circuits 153 and 163 are established by including up to the latch circuits 154 and 164 in many cases, but for the description herein the AD conversion circuits 153 and 163 are purposely distinguished from the latch circuits 154 and 164.

(Signal Processing in Column Signal Processing Circuit)

Subsequently, the respective signal processings in the column signal processing circuits 15 and 16 will be described as Embodiments 1 and 2.

Embodiment 1

The signals of the respective pixels on the read row 1 are dealt with as shown in FIG. 5(A). First, the signals are read from the pixels 11, and also the CDS processing is performed. Next, the signals after the CDS processing are amplified at the basis amplification rate (x1) and stored in the latch circuit 154 after the AD conversion. This signal amplified at the basis amplification rate and stored in the latch circuit 154 is set as S1.

The signals of the respective pixels on the read row 2 are dealt with as shown in FIG. 5(B). First, the signals are read from the pixels 11, and also the CDS processing is performed. Next, the signals after the CDS processing are amplified at 4-fold the basis amplification rate and stored in the latch circuit 164A after the AD conversion. This signal amplified at 4-fold the basis amplification rate and stored in the latch circuit 164A is set as S2. Subsequently, the same signal stored in the CDS circuit 161 is amplified at the basis amplification rate and stored in the latch circuit 164B after the AD conversion. This signal amplified at the basis amplification rate and stored in the latch circuit 164B is set as S3.

Then, the signal S1 stored in the latch circuit 154 through the horizontal scan by the horizontal drive circuit 17 is read, and also the signals S2 and S3 stored in the latch circuits 164A and 164B through the horizontal scan by the horizontal drive circuit 18 are sequentially read. In a digital signal processing circuit in a later stage (not shown in the drawing), the signals S1, S2, and S3 are subjected to a synthesis processing to realize a wider dynamic range.

The signal S1 is a signal based on the short exposure time 1 (2 H) of the respective pixels in the read row 1 and a signal dealing with the high luminance part.

The signal S2 is a signal in which a signal based on the long exposure time 2 (8 H) of the respective pixels in the read row 2 is amplified 4-fold and a signal in which the low luminance part is amplified.

The signal S3 is a signal based on the long exposure time 2 (8 H) of the respective pixels in the read row 2 and a signal dealing with the low luminance part.

In general, when the gain setting of the present CMOS image sensor 10 is lower than the predetermined gain, on the basis of an instruction from the control circuit 13, the amplification circuit 162 is switched to the basis amplification rate (x1). According to this, the respective signals S1 and S3 in which the signals of the respective pixels on the read row 1 and the signals of the respective pixels on the read row 2 are both amplified at the basis amplification rate are stored in the latch circuits 154 and 164B.

Then, while these respective signals S1 and S3 are synthesized in a signal processing for realizing a wider dynamic range in a later stage, that is, the signal S1 dealing with the high luminance part and the signal S3 dealing with the low luminance part are synthesized, as a ratio of the exposure times of the signal S1 and the signal S3, that is, the sensitivity ratio is 4-fold, an image whose dynamic range is expanded 4-fold is generated.

On the other hand, when the subject is dark but the shutter speed is not desired to be decreased, the gain setting is set equal to or higher than the predetermined gain. In this gain setting, as described above, there are two ways: a case where the analog gain before the AD conversion is increased and a case where the digital gain after the AD conversion is increased. However, if the digital gain is increased, the gradation becomes coarse, and therefore in the present example, the method of increasing the analog gain is adopted.

Upon the gain setting, as an example, with a control line extending from the control circuit 13, by changing a capacity value of a variable capacity inside the amplification circuit 162, the analog gain is increased.

When the gain setting is increased, on the basis of an instruction from the control circuit 13, with respect to the same signals from the respective pixels on the read row 2, the amplification rate of the amplification circuit 162 is switched to a 4-fold amplification rate of the basis amplification rate (x1) and the basis amplification rate.

According to this, the signal S1 in which the signals of the respective pixels on the read row 1 are amplified at the basis amplification rate, the signal S2 in which the signals of the respective pixels on the read row 2 are amplified at 4-fold the basis amplification rate, and the signal S3 in which the signals of the respective pixels on the read row 2 are amplified at the basis amplification rate are stored in the latch circuits 154, 164A, and 164B.

Then, these respective signals S1, S2, and S3 are synthesized in the signal processing for a wider dynamic range, that is, the signal S1 dealing with the high luminance part, the signal S2 in which the low luminance part is amplified, and the signal S3 dealing with the low luminance part are synthesized. Thus, in accordance with the ratio of the sensitivities of the signal S1 and the signal S3, the dynamic range is expanded, and also in accordance with the ratio of the amplification rates of the signal S2 and the signal S3, the 4-fold gain up signal can be obtained.

To elaborate, a 4-fold signal of the signal S1 through digital computation at the basic amplification rate of the read row 1, a 1-fold signal of the signal S2 through digital computation at the 4-fold gain of the basic amplification rate of the read row 2, and a 4-fold signal of the signal S3 through digital computation at the basic amplification rate of the read row 2 are respectively set as a signal of a high luminance part (x16), a signal of a low luminance part (x1), and a signal of a medium luminance part (x4).

According to this, in a case where the subject has a low luminance or the like, even if the analog gain before the AD conversion is increased to increase the sensitivity, for example, in a case where a part of the screen is bright, the bright part does not exceed the input range of the AD conversion. Thus, a failure of obtaining the originally excising signals from the signals of the long exposure time is not caused, and also the gradation at the low luminance part is not degraded. As a result, the information loss due to falling out of the input range of the AD conversion is eliminated, and it is possible to obtain the image with the good S/N.

At this time, when the gain setting is equal to or higher than the predetermined gain, as the signal S2 of the low luminance part is added, it seems that the dynamic range is apparently further expanded at 4-fold but is not fundamentally changed as the gain of the signal S3 is changed and merely added. In a case of being larger than the noise before the AD conversion when the gradation of the AD conversion is at the amplification rate of 1, this amount is expanded.

<Modified Example of Embodiment 1>

Figure 6:
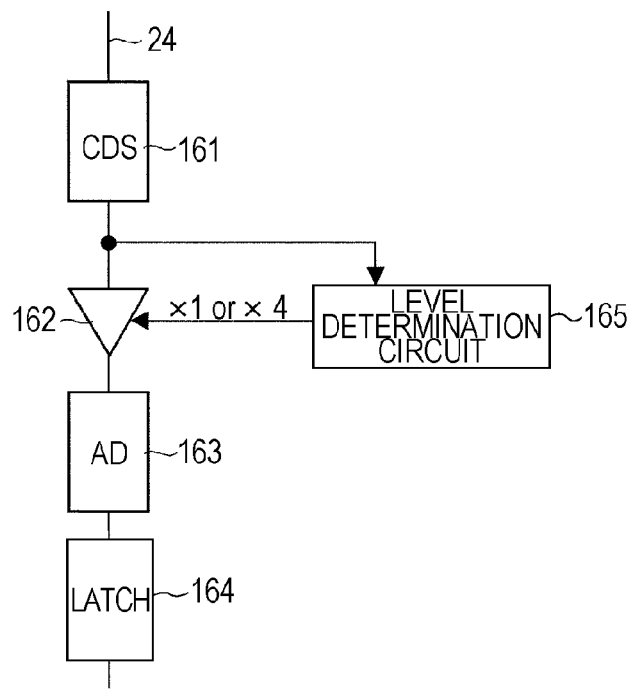
FIG. 6 is a block diagram showing a modified example of the column signal processing circuit in which a gain of an amplification circuit is variable.

FIG. 6 is a block diagram showing a modified example of the column signal processing circuit 16A in which the amplification rate of the amplification circuit is variable.

The column signal processing circuit 16A according to the present modified example is configured to determine a level of the signal of the respective pixels on the read row 2, for example, a magnitude of the signal level having passed the CDS circuit 161, sets the amplification rate of the amplification circuit 162 as 4-fold the basis amplification rate in a case where the signal level is smaller than a predetermined level, and sets the amplification rate of the amplification circuit 162 as the basis amplification rate (x1) in a case of being equal to or larger than the predetermined level.

In this manner, by adopting a configuration of switching the amplification rate of the amplification circuit 162 to 4-fold and 1-fold the basic amplification rate in accordance with the signal level of the respective pixels on the read row 2, as in the case of Embodiment 1, it is not necessary to divide and latch the signal S2 in which the signals of the respective pixels on the read row 2 are amplified at 4-fold the basic amplification rate and the signal S3 in which the signals of the respective pixels on the read row 2 are amplified at the basic amplification rate, and it is thus possible to configure the latch circuit 164 by one latch circuit, in other words, it is possible to reduce one latch circuit.

Embodiment 2

In a column signal processing according to Embodiment 2, a method is adopted to simplify the circuit and handing instead of expanding the dynamic range as much as possible. Depending on a product, this method may be more preferable.

Figure 7:
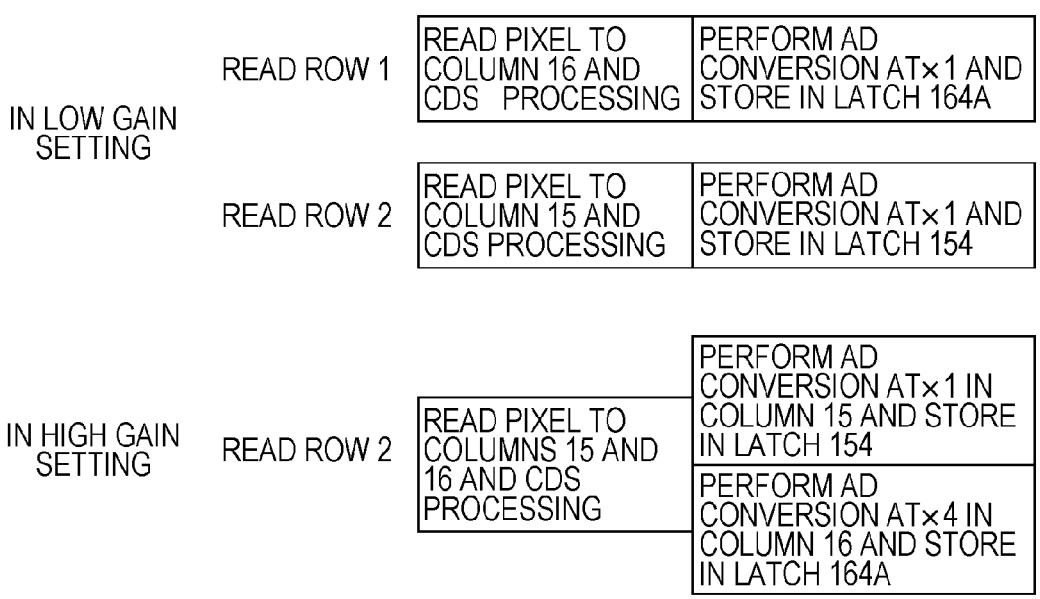
FIG. 7 shows processing sequences of a column signal processing according to Embodiment 2.

An example of the processing is shown in FIG. 7. Herein, the combination of the read rows 1 and 2 and the column signal processing circuits 15 and 16 is set opposite to Embodiment 1 due to circumstances at the time of the high gain setting. As described above, the combination of the read rows 1 and 2 and the column signal processing circuits 15 and 16 is arbitrary.

When the gain setting is lower than the predetermined gain, the signals of the respective pixels on the read row 1 are read to the column signal processing circuit 16, and the signals of the respective pixels on the read row 2 are read to the column signal processing circuit 15. Then, either of the column signal processing circuits 15 and 16 is amplified at the basic amplification rate and also subjected to the AD conversion.

When the gain setting is equal to or higher than the predetermined gain, under a control by the control circuit 13, the scan by the read scan system on the read row 1 side is performed, but the signals of the respective pixels on the read row 1 are not read to the vertical signal lines 24. The exposure time of the read row 2 remains at 8 H. The signals of the respective pixels on the read row 2 are read to both the column signal processing circuits 15 and 16. Then, in the column signal processing circuit 15, the amplification at the basic amplification rate and also the AD conversion are performed to be stored in the latch circuit 154, and in the column signal processing circuit 16, the amplification at 4-fold the basic amplification rate and the AD conversion are performed and latched, for example, in the latch circuit 164A.

In this column signal processing according to Embodiment 2, at the time of the high gain setting, the signal of the short exposure time 1 on the read row 1 is not used. The expansion of the dynamic range is only an effect by the gradation of the AD, but there are advantages that the one latch circuit on the column signal processing circuit 16 side (in the present example, the latch circuit 164B) can be eliminated, and also the AD conversion times of the column signal processing circuits 15 and 16 are set uniform, and also the bit number of the signal can be set constant.

As apparent from the above description, according to both Embodiments 1 and 2, when the gain setting is equal to or higher than the predetermined gain, the signals of the respective pixels of the long exposure time 2, that is, the signals having high sensitivities are amplified at a plurality of amplification rates: the basic amplification rate (in the present example, x1) and an amplification rate higher than that (in the present example, 4-fold the basic amplification), and also subjected to the AD conversion. Thus, even when the analog gain is increased, the information of the long exposure time is not discarded, and it is possible to obtain the image with the good S/N.

At this time, the signals of the respective pixels of the short exposure time 1, that is, the signals having low sensitivities are amplified at one amplification rate lower than a maximum of the amplification rate with respect to the signals having high sensitivities (in the present example, x4), in the present example, the basic amplification rate. Therefore, it is possible to obtain the necessary signals without unnecessary circuits or power consumption while the operation speed is not also decreased.

According to the above-mentioned Embodiments 1 and 2, the ratio of the two amplification rates is 4-fold, and the ratio of the exposure times 1 and 2, which is the ratio of the sensitivities, is also 4-fold. The ratio of the amplification rates and the ratio of the sensitivities are set equal to each other, but they may not be necessarily equal to each other.

In this regard, if the ratio of the amplification rates and the ratio of the sensitivities are set equal to each other, it is more convenient upon dealing with the signals. For example, according to Embodiment 2, as the ratio of the amplification rates and the ratio of the sensitivities are equal to each other, the bit numbers of the signals at the time of the low gain setting and at the time of the high gain setting can be uniform.

At this time, that the ratio of the amplification rates and the ratio of the sensitivities are equal to each other means not only a case of perfect matching, but also they can be regarded to be substantially equal to each other if an error is 5% or lower. That is, upon application of the present invention, in general, the ratio of the amplification rates and the ratio of the sensitivities do not necessarily need to have the perfect matching. Even if some error of about 5% exists, the error amount can be adjusted when the signals are synthesized later.

It should be noted that according to the above-mentioned embodiment, the case has been described as an example where the signals of the two systems are read as the signals of a plurality of systems having different sensitivities, but the present invention is not limited to the signals of the two and can be similarly applied to a case of reading signals of three or more systems.

Specifically, pixel signals of a plurality of systems having different sensitivities are read from the pixel array unit 12 in an analog manner. When the gain setting is lower than the predetermined gain, the pixel signals of the plurality of systems may be amplified at respective basic amplification rates, and when the gain setting is equal to or larger than the predetermined gain, a pixel signal of at least one system having a high sensitivity among the plurality of systems may be amplified at a plurality of amplification rates including an amplification rate higher than a basic amplification rate of the system having the high sensitivity (including Embodiments 1 and 2).

At this time, the amplification at the plurality of amplification rates also includes a case where a certain pixel is amplified at the basic amplification rate and a certain pixel is amplified at an amplification rate higher than the basic amplification rate in at least one system having the high sensitivity. In such a manner, the amplification is performed at only one amplification rate for each pixel (equivalent to the modified example of Embodiment 1).

Then, when the gain setting is equal to or higher than the predetermined gain, a pixel signal of at least one system having a low sensitivity among the plurality of systems is amplified at one amplification rate lower than the maximum of the plurality of amplification rates of the system having the high sensitivity (equivalent to Embodiment 1).

Alternatively, when the gain setting is equal to or higher than the predetermined gain, a pixel signal of at least one system having a low sensitivity among the plurality of systems is not used, and instead a pixel signal of at least one system having a high sensitivity is amplified at one of the plurality of amplification rates (equivalent to Embodiment 2). (Circuit Example of Column Signal Processing Circuit)

According to both Embodiments 1 and 2, in the column signal processing circuits 15 and 16 (16A), the four components, that is, the CDS circuits 151 and 161, the amplification circuits 152 and 162, the AD conversion circuits 153 and 163, and the latch circuits 154 and 164 do not need to be independent.

Hereinafter, specific circuit examples 1 and 2 in a case where the components are commonly used in the column signal processing circuit 16 where the amplification rate of the amplification circuit is variable will be described.

CIRCUIT EXAMPLE 1

Figure 8:
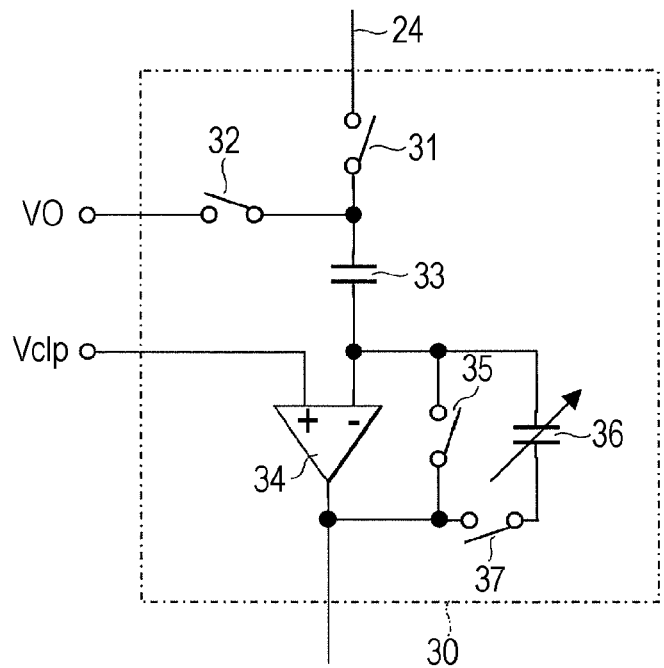
FIG. 8 is a circuit diagram showing a column signal processing circuit according to Circuit Example 1.

FIG. 8 is a circuit diagram showing a column signal processing circuit in which a CDS circuit and an amplification circuit are configured by a general charge voltage conversion amplifier according to Circuit Example 1.

A charge voltage conversion amplifier 30 constituting a part of the column signal processing circuit according to Circuit Example 1 has a known circuit configuration of having a first switch 31 whose one terminal is connected to the vertical signal lines 24, a second switch 32 connected between the other terminal of the first switch 31 and an arbitrary fixed potential VO, an input capacitance 33 whose input terminal is connected to the other terminal of the first switch 31, a differential amplifier 34 whose inverting (−) input terminal is connected to an output terminal of the input capacitance 33 and in which a clamp voltage Vclp is given to a non-inverting (+) input terminal, a third switch 35 connected between the inverting input terminal and the output terminal of the differential amplifier 34, a feedback capacitance 36 connected in series between the inverting input terminal and the output terminal of the differential amplifier 34, and a fourth switch 37 (for example, see Japanese Unexamined Patent Application Publication No. 2005-269471).

In the charge voltage conversion amplifier 30 of the above-mentioned configuration, the amplification rate is decided on the basis of a capacitance ratio of the input capacitance 33 and the feedback capacitance 36. Therefore, as the feedback capacitance 36 is set as a variable capacitance, and the capacitance value is switched, it is possible to convert the amplification rate of the charge voltage conversion amplifier 30, for example, from the basic amplification rate (x1) to the 4-fold amplification rate thereof.

Also, as the feedback capacitance 36, for example, a feedback capacitance 36A having a capacitance value corresponding to the basic amplification rate and a feedback capacitance 36B having a capacitance value corresponding to 4-fold the basic amplification are provided in a parallel manner and one of them is selected, so that it is also possible to switch the amplification rate of the charge voltage conversion amplifier 30 between the basic amplification rate and the 4-fold amplification rate thereof.

CIRCUIT EXAMPLE 2

Figure 9:
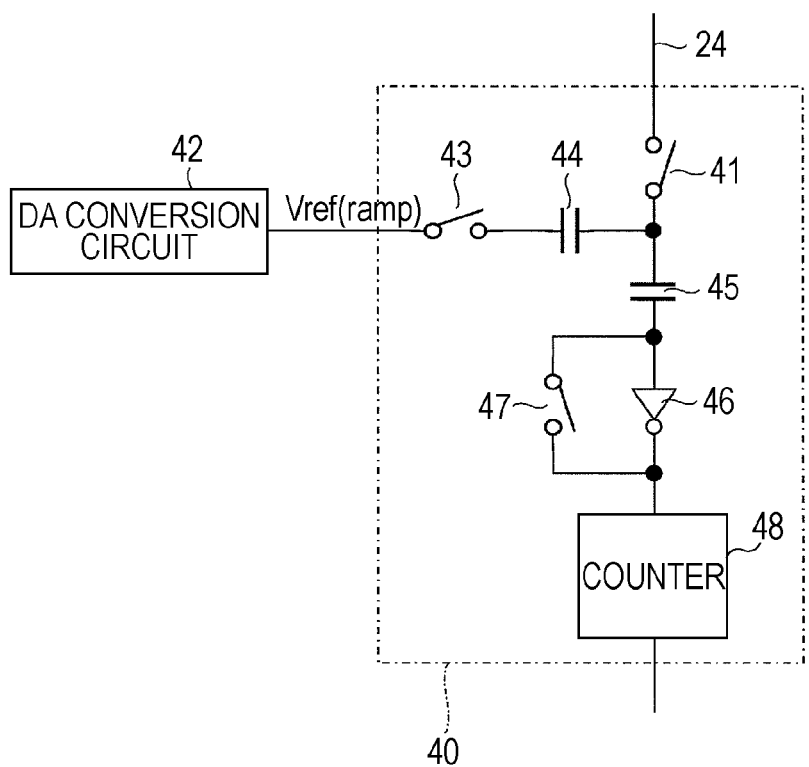
FIG. 9 is a circuit diagram showing a column signal processing circuit according to Circuit Example 2.

FIG. 9 is a circuit diagram showing a column signal processing circuit according to Circuit Example 2 in which from the CDS circuit up to the AD conversion circuit are indivisible.

A column signal processing circuit 40 according to Circuit Example 2 has a known circuit configuration having a first switch 41 whose one terminal is connected to the vertical signal lines 24, a second switch 43 and a first capacitor 44 connected in series between an output terminal of a DA conversion circuit 42 existing outside the column signal processing circuit 40 and the other terminal of the first switch 41, a second capacitor 45 whose one end is connected to the other end of the first switch 41, an inverter 46 whose input terminal is connected to the other terminal of the second capacitor 45, a third switch 47 connected between the input terminal and an output terminal of the inverter 46, and a counter 48 whose input terminal is connected to the other terminal of the third switch 47 (for example, see Japanese Patent No. 3361005).

In the column signal processing circuit 40 of the above-mentioned configuration, a waveform of a reference voltage Vref output from the DA conversion circuit 42 is set as a ramp (ramp) waveform, and a time duration in which an output of the inverter 46 is at a high level is counted by the counter 48, so that it is possible to obtain a digital output value corresponding to an input signal voltage, that is, it is possible to perform the AD conversion. The gradation of the AD conversion is decided by an inclination of the ramp wave of the reference voltage Vref.

In this column signal processing circuit 40, the signal from the pixel is not directly amplified, but the amplification rate with respect to the signal from the pixel is decided on the basis of the inclination of the ramp wave of the reference voltage Vref for deciding the gradation of the AD conversion. Then, as the inclination of the ramp wave of the reference voltage Vref is moderated to ¼ of the inclination for deciding the basic amplification rate, practically, it is possible to set the amplification rate with respect to the signal from the pixel as a 4-fold amplification rate of the basic amplification rate.

By configuring the column signal processing circuit 16 (16A) by using the charge voltage conversion amplifier 30 according to Circuit Example 1 described above or the column signal processing circuit 40 according to Circuit Example 2, the circuit configuration of the column signal processing circuit 16 (16A) can be simplified, and also the switching of the amplification rate of the column signal processing circuit 16 (16A) between the basic amplification rate and an amplification rate higher than that can be easily realized.

MODIFIED EXAMPLE

Thus far, in order to facilitate the understanding, the simple example has been described, but various applications can be made in actuality. For example, instead of two column signal processing circuits on one column (in the present example, two on the upper and lower of the pixel array unit 12), such a type may also suffice that one column signal processing circuit is provided on one column, and the signals of the respective pixels on a plurality of rows are sequentially processed in the one column signal processing circuit.

Also, the read rows for the dynamic range expansion are three rows or more, and the switching of the amplification rates may also be applied with respect to only the row having the longest exposure time. Furthermore, the amplification rates may also not be 1-fold and 4-fold. For example, expansions can be made in diverse ways such as 1-fold and switching among 2, 4, 8, and 16-fold for the other one, or three signals at 1-fold, 4-fold, and 16-fold are always created.

It should be noted that according to the above-mentioned embodiment, the case of the CMOS image sensor configured by arranging the unit pixels 11 in a row-column manner for detecting the signal charge in accordance with the light amount of the visible light as the physical quantity has been described while taking as an example, but the present invention is not limited to the application to the CMOS image and can be applied to a general image sensor for realizing an expansion of the dynamic range for the respective pixels of the pixel array unit by obtaining the signals of a plurality of systems having different sensitivities while varying the exposure times and synthesizing these signals of the plurality of systems.

Also, the present invention is not limited to the application to the image sensor for detecting a distribution of the incident amount of the visible light for the image pickup as the image, but can be applied to a general solid-state image pickup apparatus (a physical quantity distribution detection apparatus) such as an image sensor for image pickup on a distribution of the incident amount of infra-red ray, X-ray, particles, or the like as an image and a finger print detection sensor for detecting a distribution of another physical quantity such as pressure or electrostatic capacitance in a broad sense for image pickup as an image.

Furthermore, the present invention is not limited to the solid-state image pickup apparatus for sequentially scanning the respective pixels of the pixel array unit in units of row and read the signals of the respective pixels, but can be also applied to an X-Y address type solid-state image pickup apparatus for selecting an arbitrary pixel in units of pixel and read a signal from the selected pixel in units of pixel.

It should be noted that the solid-state image pickup apparatus may also have a mode of being formed as one chip and may also have a mode in a module state having an image pickup function in which an image pickup unit and a signal processing unit or an optical system are collectively packaged.

Also, the present invention is not limited to the application to the solid-state image pickup apparatus, but can also be applied to an image pickup apparatus. At this time, the image pickup apparatus refers to a camera system such as a digital still camera or a video camera or an electronic device having an image pickup function such as a mobile phone device. It should be noted that the above-mentioned mode of the module state mounted to the electronic device, that is, a camera module is set as the image pickup apparatus in some cases.

[Image Pickup Apparatus]

FIG. 10 is a block diagram showing a configuration example of an image pickup apparatus according to the present invention. As shown in FIG. 10, the image pickup apparatus according to the present invention has an optical system including a lens group 51, a solid-state image pickup apparatus 52, a DSP (Digital Signal Processor) circuit 53 which is a camera signal processing circuit, a frame memory 54, a display apparatus 55, a recording apparatus 56, an operation system 57, a power source system 58, and the like, and has a configuration in which the DSP circuit 53, the frame memory 54, the display apparatus 55, the recording apparatus 56, the operation system 57, and the power source system 58 are mutually connected via a bus line 59.

The lens group 51 takes in the incident light (image light) from the subject to be imaged on an imaging surface of the solid-state image pickup apparatus 52. The solid-state image pickup apparatus 52 converts the light amount of the incident light imaged on the imaging surface by the lens group 51 into an electric signal in units of pixel and outputs as a pixel signal. As this solid-state image pickup apparatus 52, the CMOS image sensor 10 according to the above-mentioned embodiment is used.

The DSP circuit 53 performs various signal processings on the pixel signal output from the solid-state image pickup apparatus 52. As one of the processings, the DSP circuit 53 performs a signal processing for a wider dynamic range. Other than this signal processing, the DSP circuit 52 performs known various camera signal processings.

In the signal processing for a wider dynamic range, when the gain setting of the CMOS image sensor 10 is lower than the predetermined gain, the DSP circuit 52 obtains a signal whose dynamic range is expanded 4-fold in the previous embodiment case by synthesizing the respective signals S1 and S3 in which the signals of the respective pixels on the read row 1 and the signals of the respective pixels on the read row 2 output from the CMOS image sensor 10 are both amplified at the 1-fold amplification rate.

Also, when the gain setting of the CMOS image sensor 10 is high, the DSP circuit 52 obtains a 4-fold gain up signal by synthesizing the signal S1 in which the signals of the respective pixels on the read row 1 output from the CMOS image sensor 10 are amplified at the 1-fold amplification rate, the signal S2 in which the signals of the respective pixels on the read row 2 are amplified at the 4-fold amplification rate, and the signal S3 in which the signals of the respective pixels on the read row 2 are amplified at the 1-fold amplification rate.

The display apparatus 55 is composed of a panel type display apparatus such as a liquid crystal display apparatus or an organic EL (electro luminescence) display apparatus and displays a moving image or a still image picked up by the solid-state image pickup apparatus 52. The recording apparatus 56 records the moving image or the still image picked up by the solid-state image pickup apparatus 52 on a recording medium such as a video tape or a DVD (Digital Versatile Disk).

The operation system 57 issues operation instructions regarding various functions of the present image pickup apparatus under operations by the user. The power source system 58 appropriately supplies various power sources which function as operation power sources for the DSP circuit 53, the frame memory 54, the display apparatus 55, the recording apparatus 56, and the operation system 57 to these supply targets.

As described above, in the image pickup apparatus such as the video camera, the digital still camera, and further, the camera module for the mobile device such as the mobile phone device, by using the CMOS image sensor 10 according to the above-mentioned embodiment as the solid-state image pickup apparatus 52, in the CMOS image sensor 10, for realizing a wider dynamic range by obtaining the signals of a plurality of systems having different sensitivities, when the analog gain is increased, the advantage is obtained that the image quality of the picked up image can be further improved as the information loss due to falling out of the input range of the AD conversion is eliminated, and the image having the good S/N.

According to the present invention, when the analog gain is increased, the failure of obtaining the originally excising signals from the signals of the long exposure time is not caused, and also the gradation at the low luminance part is not degraded. As a result, the information loss due to falling out of the input range of the AD conversion is eliminated, and it is possible to obtain the image with the good S/N.

The invention claimed is:

1. A solid-state image pickup apparatus characterized by comprising:
    a pixel array unit composed by two-dimensionally arranging pixels for detecting a physical quantity in a row-column manner;
    drive means for performing a drive for reading pixel signals of a plurality of systems having different sensitivities from the pixel array unit in an analog manner; and
    signal processing means for amplifying the pixel signals of the plurality of systems at respective basic amplification rates when a gain setting of the analog pixel signals is lower than a predetermined gain and amplifying a pixel signal of at least one system having a high sensitivity among the plurality of systems at a plurality of amplification rates including an amplification rate higher than a basic amplification rate of the system having the high sensitivity when the gain setting is equal to or higher than the predetermined gain.

2. The solid-state image pickup apparatus according to claim 1, characterized in that when the gain setting is equal to or higher than the predetermined gain, among the plurality of systems, the signal processing means amplifies a pixel signal of at least one system having a low sensitivity at one amplification rate lower than a maximum of the plurality of amplification rates of the system having the high sensitivity.

3. The solid-state image pickup apparatus according to claim 2, characterized in that when the gain setting is lower than the predetermined gain, the signal processing means amplifies the pixel signals having the high sensitivity at an amplification rate higher than a basis amplification rate.

4. The solid-state image pickup apparatus according to claim 1, characterized in that when the gain setting is equal to or higher than the predetermined gain, among the plurality of systems, the signal processing means does not use a pixel signal of at least one system having a low sensitivity and instead amplifies the pixel signal of at least one system having the high sensitivity at one of the plurality of amplification rates.

5. The solid-state image pickup apparatus according to claim 1, characterized in that the drive means varies the sensitivities of the plurality of systems by varying detection times at which the pixels detect a physical amount.

6. The solid-state image pickup apparatus according to claim 5, characterized in that when a plurality of read rows of the pixel array unit are scanned and the pixel signals of the plurality of systems are read from respective pixels of the plurality of read rows, the drive means adjusts lengths of the detection times at an interval for scanning the plurality of read rows.

7. The solid-state image pickup apparatus according to claim 1, characterized in that the signal processing means adjusts the amplification rate in accordance with a magnitude of a signal level before AD conversion.

8. The solid-state image pickup apparatus according to claim 1, characterized in that a ratio of the plurality of amplification rates is equal to a ratio of the sensitivities of the plurality of the systems.

9. A drive method for a solid-state image pickup apparatus, characterized by comprising:
    reading pixel signals of a plurality of systems having different sensitivities in an analog manner from a pixel array unit composed by two-dimensionally arranging pixels for detecting a physical quantity in a row-column manner;
    amplifying the pixel signals of the plurality of systems at respective basic amplification rates when a gain setting of the analog pixel signals is lower than a predetermined gain; and
    amplifying a pixel signal of at least one system having a high sensitivity among the plurality of systems at a plurality of amplification rates including an amplification rate higher than a basis amplification rate of the system having the high sensitivity when the gain setting is equal to or higher than the predetermined gain.

10. An image pickup apparatus characterized by comprising:
    a pixel array unit composed by two-dimensionally arranging pixels for detecting a physical quantity in a row-column manner;
    drive means for performing a drive for reading pixel signals of a plurality of systems having different sensitivities from the pixel array unit in an analog manner;
    first signal processing means for amplifying the pixel signals of the plurality of systems at respective basis amplification rates when a gain setting of the analog pixel signals is lower than a predetermined gain and amplifying a pixel signal of at least one system having a high sensitivity among the plurality of systems at a plurality of amplification rates including an amplification rate higher than a basic amplification rate of the system having the high sensitivity when the gain setting is equal to or higher than the predetermined gain; and
    second signal processing means for realizing an expansion of a dynamic range by synthesizing the signals of the plurality of systems having passed the first signal processing means.

* * * * *